United States Patent [19]

Shwartzman

[11] Patent Number: 4,543,130

[45] Date of Patent: Sep. 24, 1985

[54] MEGASONIC CLEANING APPARATUS AND METHOD

[75] Inventor: Stanley Shwartzman, Somerville, N.J.

[73] Assignee: RCA Corporation, Princeton, N.J.

[21] Appl. No.: 645,067

[22] Filed: Aug. 28, 1984

[51] Int. Cl.⁴ .............................................. B08B 3/12
[52] U.S. Cl. ......................................... 134/1; 134/18; 134/113; 134/184
[58] Field of Search ..................... 134/1, 18, 113, 184; 310/322, 324, 334, 337; 367/162, 163, 166, 171; 366/127

[56] References Cited

U.S. PATENT DOCUMENTS

| | | | |
|---|---|---|---|
| 2,760,501 | 8/1956 | Gander | 134/1 X |
| 2,828,231 | 3/1958 | Henry | 134/1 |
| 3,073,578 | 1/1963 | Jeffrey | 134/1 X |
| 3,240,963 | 3/1966 | Sasaki | 134/1 X |
| 3,318,578 | 5/1967 | Branson | 134/1 X |
| 3,405,916 | 10/1968 | Carmichael | 134/1 X |
| 3,520,724 | 7/1970 | Massa | 134/184 X |
| 3,893,869 | 7/1975 | Mayer et al. | 134/86 |
| 4,118,649 | 10/1978 | Shwartzman et al. | 310/337 |
| 4,167,424 | 9/1979 | Jubenville et al. | 134/1 |
| 4,367,098 | 1/1983 | McCord | 134/1 |
| 4,375,991 | 3/1983 | Sachs et al. | 134/1 |
| 4,441,517 | 4/1984 | Phillips | 134/184 X |

*Primary Examiner*—Marc L. Caroff
*Attorney, Agent, or Firm*—Birgit E. Morris; Donald S. Cohen; Joseph D. Lazar

[57] ABSTRACT

Cleaning apparatus for cleaning semiconductor wafers and the like in a chamber of cleaning fluid vibrating at ultrasonic (megasonic) frequencies utilizing an electrically energized transducer, such as a piezoelectric crystal, mounted on a conductive foil formed of tantalum or zirconium. Pinholes or other ruptures in the foil can cause high energy arcs capable of exploding vapors of inflammable solvents. The foil carrying the transducers is isolated from the cleaning fluid vapors by a closed buffer chamber containing an inert liquid that couples vibratory energy to the cleaning fluid and another closed chamber enclosing the transducers. Accordingly, cleaning fluids, such as the acetones, alcohols and ketones, heretofore considered hazardous fluids, can be used in the apparatus.

5 Claims, 1 Drawing Figure

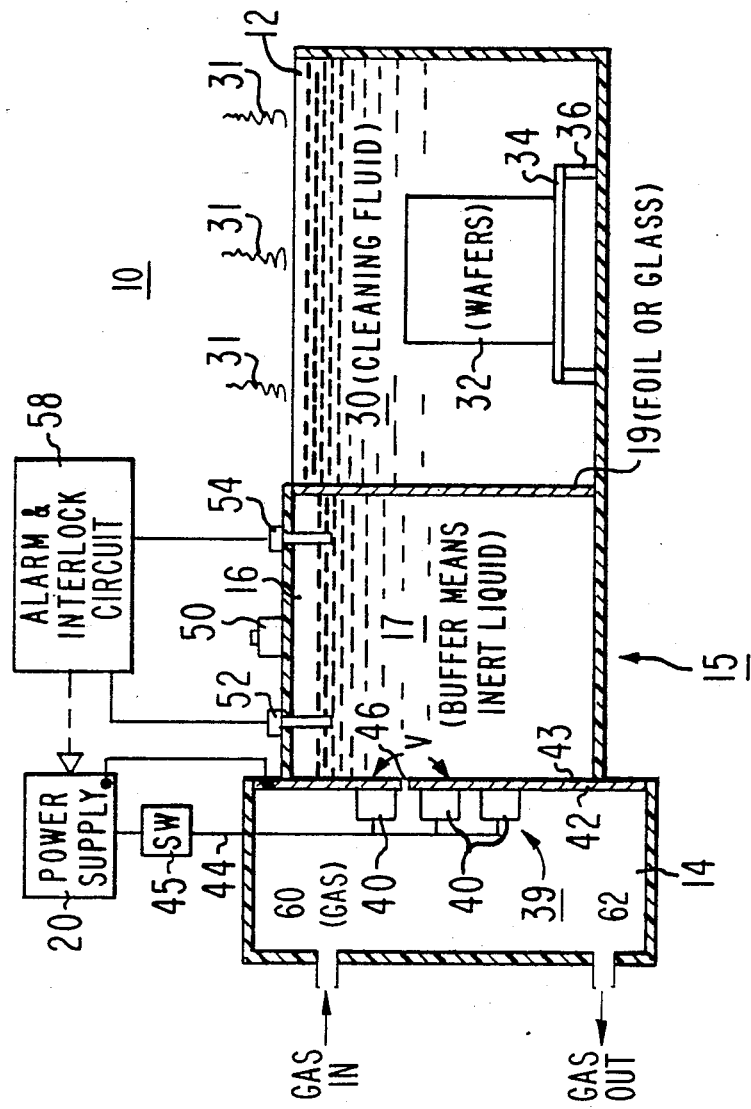

MEGASONIC CLEANING APPARATUS AND METHOD

This invention relates to cleaning apparatus particularly of the type using high frequency vibrating energy in a cleaning liquid to clean semiconductor wafers and the like.

BACKGROUND OF THE INVENTION

Cleaning systems for use in manufacturing semiconductor devices utilize ultrasonic energy from transducer crystals which causes a vibratory beam to be propagated into certain chemical cleaning solutions. The crystals may oscillate at an ultrasonic frequency in the range of between about 0.2 and 5 MHz. Such cleaning systems are sometimes known as "megasonic" cleaning systems. These systems are known to remove particles down to a least 0.3 micrometer in diameter from the surface of semiconductor wafers together with organic surface film, ionic impurities, and many other contaminants that may be on the surface. Such systems are useful to clean semiconductor wafers at all processing steps as well as cleaning ceramics and photomasks. They may also be used for photoresist removal, dewaxing and deglazing by using a suitable solvent or cleaning fluid as well as different types of stripping solutions. See U.S. Pat. No. 3,893,869 issued on July 8, 1975 to Alfred Mayer and Stanley Shwartzman for a description of such a cleaning apparatus. See also U.S. Pat. No. 4,118,649 issued on Oct. 3, 1978 to Stanley Shwartzman and Alfred Mayer for a particular form of transducer assembly useful in such apparatus.

In such systems in which the transducers are mounted on a membrane of conductive material, such as a tantalum or zirconium foil typically 5 to 50 micrometers thick, a pinhole or other rupture in the foil can develop and be the site of an electrical arc produced by the high voltages (approximately 1000 volts) used to drive the transducers. A typical transducer is a piezoelectric type requiring such high voltages in order to generate an adequately high energy beam. The transducer vibrates the foil on which it is mounted to agitate the cleaning fluid which is in direct contact with the foil. If a volatile and inflammable solvent were to be used as the cleaning liquid in such apparatus, the vapors therefrom could cause, if ignited by a pinhole arc, for example, an explosion or fire. It is because of this eventuality that cleaning apparatus utilizing electrically energized transducers do not use explosive type solvents. The use of such solvents in this art is highly desirable but is proscribed by such unpredictable, unsafe and hazardous conditions.

Accordingly, there is a need in the art to provide a megasonic cleaning apparatus of the type described that is inherently safe from such eventualities when used with volatile or inflammable solvents.

SUMMARY OF THE INVENTION

The apparatus of the invention includes a chamber containing articles to be cleaned immersed in a cleaning fluid that is vibrated by a high frequency mechanical energy beam generated by an electrically energized transducer mounted on a vibratory conductive membrane. The transducer and the membrane are isolated from the vapors of the cleaning fluid avoiding thereby hazardous explosions and fires.

BRIEF DESCRIPTION OF THE DRAWING

The sole FIGURE is a schematic in elevation of the megasonic apparatus embodying the present invention.

DETAILED DESCRIPTION OF THE PREFERRED EMBODIMENT

Cleaning apparatus 10 of the invention, as seen in the drawing, comprises a conventional megasonic cleaning chamber 12 having an open top and typically being partially filled with a conventional cleaning fluid 30, such as a mixture of amonium hydroxide, hydrogen peroxide and water at a volumetric ratio of 1:1:4. The chamber 12 is formed of an inert plastic, such as polypropylene, to provide a chamber environment that is free of contaminating metals. Conventional fluids are used since they are not prone to explode or combust. One or more articles to be cleaned, such as, for example, wafers 32, are positioned within the chamber 12 on a support table 34 with support pedestals 36.

In operation, vapors 31 may develop from the fluid 30 and rise into and become part of the ambient. In conventional cleaners, such vapors cannot be explosive or inflammable due to the potential hazards. A closed chamber 14 contains a conventional megasonic cleaning transducer assembly 39 which includes an array of one or more transducers 40 mounted on a foil membrane 42. The chamber 14 in the prior art cleaning application is typically positioned adjacent the cleaning chamber 12.

The chamber 16 seen in the drawing, it should be understood, is not part of a conventional apparatus, as will be described in detail hereinafter. In such prior art apparatus, the foil membrane face 43, remote from the transducers 40, is typically in direct contact with the cleaning fluid 30 to cause vibratory action generated by the transducers 40 and imparted to the foil membrane 42 directly into the fluid 30 in chamber 12. The base of the respective transducers 40 is connected in common to the foil membrane 42 serving therefor as a common electrical terminal to a power supply 20. The individual transducers 40 are respectively energized via one or more conductors 44 and a control switch 45 to selectively energize the transducers 40 as desired.

The operation of such apparatus in conventional form, as described so far, is described in detail in the above-identified U.S. Pat. No. 3,893,869. In brief, the cleaning of the wafers 32 is achieved by energizing the transducers 40 to effect a beam of high frequency energy from the vibrating membrane 42 to be transmitted into the fluid 30 contained in chamber 12. If one were to use a cleaning fluid such as a solvent which is explosive or otherwise inflammable, vapors 31 therefrom could be exploded by an arc that may be created across a pinhole 46 as shown in foil membrane 43. The high voltages (e.g., 1000 volts) used to energize the transducers 40 can cause electric fields in the foil membrane 42 and thus generate such arcs. Such an arc V, indicated by the arrows across the pinhole 46, could be of sufficient magnitude in voltage as to ignite an inflammable vapor 31. Moreover, a transducer 40 that is malfunctioning by overuse or by inherent structural faults may also develop an arc or otherwise develop a hot spot in the foil membrane 42. Such condition can also cause a fire or explosion when contacted by the fluid 30 or vapors 31 therefrom. Any of these hazardous situations are obviously unsafe and, accordingly, undesirable.

According to the present invention, a buffering means 15 is provided to prevent or otherwise inhibit the effects of an arc V or hot spots from developing in a damaged or punctured membrane 42. This buffering means 15 is achieved in one embodiment of the invention by a closed buffer chamber 16 positioned between the cleaning fluid 30 in the the cleaning chamber 12 and the transducer chamber 14, particularly the foil membrane 42.

The buffer chamber 16, also formed conveniently of polypropylene, serves to isolate the transducer assembly 14, particularly the transducers 40 and the foil membrane 42 from the cleaning fluid 30 in chamber 12. The chamber 16 thus isolates the vapors 31 in the ambient from the transducers 40 and membrane 42. The chamber 16 also couples the energy from the vibratory membrane 42 to the cleaning chamber 12 via an inert liquid 17 and a vibratory membrane 19. Membrane 19 is formed of foil, for example, of tantalum or zirconium, typically 0.5 to 1.0 millimeter thick. Membrane 19 can also be formed of glass or quartz, about 1 to 4 millimeters thick. The spacing between membrane 42 and membrane 19 is about 6 inches (150 cm.). Membrane 19 thus serves to couple the energy from the vibrating liquid 17 into the cleaning fluid 30 to thereby clean the wafers 32 in a conventional manner.

The buffer chamber 16 is filled with the inert liquid 17 that is both non-explosive and non-inflammable. Liquid 17 may be water or fluorinated hydrocarbon (such as Freon). However, any inert liquid may be used. A dye may be added to the liquid 17 so that leaks from the chamber 16 may be readily seen. A fill valve 50 is used to fill the chamber 16. The liquid 17 is filled in chamber 16 to a level sufficient to be higher in elevation than the location of the highest transducer 40 to prevent hot spots from being developed in the foil membrane 42 or to otherwise inhibit the harmful effects of hot spots. A hot spot can develop in the foil by the high energy and high frequency vibration of the transducer 40 if the area adjacent the transducer 40 is not coupled or in contact with a heat sink. The liquid 17 serves thus not only to couple energy to the cleaning chamber 12, but also acts as a heat sink to prevent or to otherwise inhibit the effects of hot spots. More importantly, any arc V that may develop in a rupture in the foil membrane 43 is rendered harmless in the presence of the inert liquid 17.

A pair of conventional level sensors 52 and 54 is provided to sense the level of the liquid 17. It is preferred that the liquid 17 at least nearly fill the chamber 16 to cover the foil 42 adjacent the transducers 40. The sensors 52 and 54 are spaced apart to improve sensitivity of sensing the liquid level. They function thus to indicate loss of the liquid 17. The sensors 52 and 54 are connected to an alarm and interlock circuit 58 to provide an alarm and to interrupt the power of power supply 20, as indicated by the dotted line path 21, if the level of liquid 17 drops below the predetermined level as explained above.

Any puncture or rupture in the foil membrane 42, such as a pinhole 46, may allow the liquid 17 to pass into the transducer chamber 14. However, since the liquid 17 is inert, no explosion can occur in the presence of an arc V that may exist across the hole 46 or components of the transducer assembly 39. When the level of the liquid 17 drops below the critical sensing level, the alarm and interlock circuit 58 will be operated.

In accordance with another feature of the invention, an inert coolant gas, such as nitrogen, is provided with a gas input port 60 and an outlet port 62 to cool the transducers 40. Any suitable coolant inert gas may be used. According to another feature of the invention, the gas in chamber 14 is pressurized sufficiently to essentially prevent vapors 31 from entering therein. Accordingly, the chamber is isolated from the fluid vapors 31. Any hot spots or arcing that may develop in the chamber 14 will therefore not be dangerous in the sense of combusting or exploding the fluid vapors 31.

Suitable cleansing fluids 30 that can be used in the practice of the invention to provide improved cleaning of the devices include any of the conventional cleaning solvents such as the acetones, alcohols and ketones used for cleaning purposes in other environments. It will be appreciated that heretofore such solvents were not used in megasonic cleansing apparatus owing to the potential hazards of fires or explosions.

Accordingly, the apparatus 10, when provided with a buffer chamber 16, completely isolates the transducers 40 and the membrane 42 on which they are mounted from the ambient. With such an arrangement, any arcing that may be generated by a faulty transducer assembly will be isolated from potentially hazardous vapors. Accordingly, the apparatus 10 of the invention is inherently safe.

What is claimed is:

1. A method of cleaning a surface of an article in a cleaning fluid in a first chamber by vibrating the cleaning fluid at a high frequency by an electrically energized transducer mounted on a vibratory electrically conductive membrane in a third closed chamber comprising the step of isolating the transducer and the membrane from cleaning fluid vapors to prevent thereby accidental explosions or fires by positioning a second closed chamber containing inert liquid between said first and third chambers, said second chamber having a vibratory wall in common with each of said first and third chambers.

2. The method of claim 1 wherein said second chamber contains both an inert liquid and a dye whereby liquid that may leak from said second chamber is readably observable.

3. In an apparatus for cleaning a surface of an article in a first chamber containing cleaning fluid, the improvement comprising:

a second closed chamber substantially filled with an inert liquid;

a first vibratory wall common to said first chamber and said second chamber;

a third closed chamber; and a second vibratory wall common to said second and third chambers; said second wall being formed of a vibratory electrically conductive membrane supporting one or more electrically energizable vibratory transducers, said transducers being energized by means including said conductive membrane for vibrating said membrane, whereby vibrations of said membrane are coupled to the inert liquid in said second chamber to vibrate said inert liquid, said vibrating inert liquid, in turn, vibrating said first wall and said cleansing fluid, and whereby vapors from the cleaning fluid in said first chamber are isolated from contacting said transducer and said second wall.

4. The apparatus of claim 3 further includes means responsive to the level of said inert liquid for providing an alarm, said alarm being indicative of a loss of said inert liquid from said second chamber.

5. The apparatus of claim 3 further including means for providing inert coolant gas under pressure into said third chamber to cool said transducers and to isolate said third chamber from said vapors.

* * * * *